United States Patent
Wu

(10) Patent No.: US 6,353,256 B1
(45) Date of Patent: Mar. 5, 2002

(54) IC PACKAGE STRUCTURE FOR ACHIEVING BETTER HEAT DISSIPATION

(75) Inventor: Chi Chuan Wu, Taichung (TW)

(73) Assignee: Siliconware Precision Industries Co., Ltd. (TW)

(*) Notice: Subject to any disclaimer, the term of this patent is extended or adjusted under 35 U.S.C. 154(b) by 0 days.

(21) Appl. No.: 09/659,078

(22) Filed: Sep. 11, 2000

(51) Int. Cl.⁷ .............................................. H01L 23/04
(52) U.S. Cl. ........................ 257/698; 257/712; 257/720
(58) Field of Search ................................ 257/712, 702, 257/704, 700, 720, 698, 717, 719, 678

(56) References Cited

U.S. PATENT DOCUMENTS 5,291,062 A * 3/1994 Higgins, III ................. 257/698
5,796,038 A   8/1998 Manteghi

* cited by examiner

Primary Examiner—Olik Chaudhuri
Assistant Examiner—Dilinh Nguyen

(74) Attorney, Agent, or Firm—Lowe Hauptman Gilman & Berner, LLP

(57) ABSTRACT

With increasing density and improving performance as well as growing function variety of the circuits integrated in a semiconductor chip, the heat dissipating capability of an IC package must be effectively promoted. An IC package based on a simple structure while capable of achieving better heat dissipation is therefore suggested by the present invention. The present invention is applicable to the IC package in which at least a semiconductor unit is located on the same side of substrate as terminals (such as solder balls or cylindrical terminals) are. The basic structure of the IC package comprises an electronic apparatus and a heat dissipater. The electronic apparatus includes a carrier such as a substrate, at least a semiconductor unit such as a chip/die, and at least a cylindrical terminal. The semiconductor unit and the cylindrical terminal attaches in approximately the same direction to the carrier. The heat dissipater includes at least a through-hole for the cylindrical terminal to penetrate, thereby the heat dissipater may be close to the carrier, whereby the IC package provides better heat dissipation without need of larger or more complicated structure.

20 Claims, 3 Drawing Sheets

IC PACKAGE STRUCTURE FOR ACHIEVING BETTER HEAT DISSIPATION

FIELD OF THE INVENTION

The present invention relates to a package structure for packaging electronic components and for achieving better heat dissipation, and particularly to a package structure in which better heat dissipation can be achieved and at least a chip is a bottom chip (the chip that is on the same side of a substrate as solder balls or cylindrical terminals are).

BACKGROUND OF THE INVENTION

With increasing density and upgraded performance as well as growing function variety of the circuits integrated in a semiconductor chip, the heat dissipating capability of an IC package must be effectively promoted.

FIG. 1 shows a typical structure conventionally used for dissipating the heat which is inherent in an IC package. In FIG. 1, flip chip 11 connects substrate 13 via bump 12, heat dissipater 14 attaches to chip 11 and substrate 13 via adhesive material 16. The package with such a structure connects external circuits or apparatus via solder balls 15. Heat dissipation by such a scheme is only applicable to a package in which no chip is on the same side of substrate as connection terminals (such as the solder balls in a conventional IC package) are, and its heat dissipating capability is quite limited.

Although the art disclosed in U.S. Pat. No. 5,796,038 differs from the above conventional scheme, its structure is very complicate and is only applicable to packaging wire bonding chips.

SUMMARY OF THE INVENTION

It is thereof an object of the present invention to provide a package structure capable of achieving better heat dissipation and applicable to a package in which at least a chip is located on the same side of chip carrier as connection terminals are.

It is thereof another object of the present invention to provide a relatively simple package structure capable of achieving better heat dissipation and applicable to a package in which at least a chip is located on the same side of chip carrier as connection terminals are.

A particular object of the present invention is to provide a package structure capable of achieving better heat dissipation and applicable to a package in which at least a chip is located on the same side of chip carrier as the connection terminals that are in the shape of a cylinder.

The present invention differs significantly from the prior art disclosed in U.S. Pat. No. 5,796,038. The difference is depicted as follows: According to the prior art, a sheet of aluminum having an insulation layer as its upper surface is stuck onto the bottom surface of a chip carrier such as a sheet of material formed of polyimide/epoxy, the chip carrier has an open portion in its central region, with a wire bonding chip or die located in the open portion and having its bottom surface attached to the upper surface of the sheet of aluminum, both the chip carrier and the sheet of aluminum include through-holes correspondingly aligned in such a way that each solder ball may penetrate a through-hole in the chip carrier and a corresponding through-hole in the sheet of aluminum to connect a conductor on the upper surface of the chip carrier, and thereby to electrically connect the chip via the conductor; while the present invention suggests that at least a chip or any component alike is attached to the same side of a chip carrier as cylindrical terminals are, and a heat dissipater having through-holes which are adapted to the size and location of the cylindrical terminals is attached to an exposed surface of the chip (or a sealing structure such as an encapsulation for the chip) and a surface of the carrier such as the zone for connecting the cylindrical terminals, with the through-holes thereof providing spaces for the terminals to penetrate.

The basic architecture of the package suggested by the present invention comprises:

an electronic apparatus including a carrier such as a substrate or any object capable of supporting semiconductor units and providing electrical connection, at least a semiconductor unit such as a chip/die, and at least a cylindrical terminal, the semiconductor unit and the cylindrical terminal attaching in approximately the same direction to the carrier, the semiconductor unit attaching to the carrier via a first surface of the semiconductor unit, the carrier providing electrical connection between the semiconductor unit and the cylindrical terminal; and a heat dissipater including a first part and a second part, the first part being close to a second surface of the semiconductor unit, the second part including at least a through-hole for the cylindrical terminal to penetrate, thereby the second part of the heat dissipater may be close to the carrier (the meaning of "approach" or "approaching" or "be close to" throughout this disclosure includes the status of "contact" or "contacting").

Another aspect of the present invention may be a package structure comprising:

an electronic apparatus including a carrier such as a substrate or any object capable of supporting semiconductor units and providing electrical connection, at least a semiconductor unit such as a chip/die, at least a bonding wire, a sealing structure such as an encapsulation, and a cylindrical terminal, the semiconductor unit and the cylindrical terminal attaching in approximately the same direction to the carrier, the semiconductor unit attaching to the carrier via a first surface of the semiconductor unit, the bonding wire having a first end electrically connecting the semiconductor unit via a second surface of the semiconductor unit and having a second end electrically connecting the cylindrical terminal via the carrier, the sealing structure covering the semiconductor unit and the bonding wire; and a heat dissipater including a first part and a second part, the first part being close to the sealing structure, the second part including at least a through-hole for the cylindrical terminal penetrate, thereby the second part of the heat dissipater may be close to the carrier.

A further aspect of the present invention may be a package structure comprising:

An electronic apparatus including a carrier, at least a semiconductor unit, at least a cylindrical terminal, and a semiconductor-electrical-connection-device such as a bump or a bonding wire, the carrier including a semiconductor connection zone, a terminal connection zone, and at least a trace, the cylindrical terminal and the semiconductor unit respectively jutting out form the terminal connection zone and the semiconductor connection zone in approximately the same direction, the trace electrically connecting the cylindrical terminal and electrically connecting the semiconductor unit via the semiconductor-electrical-connection-device; and a heat dissipater including a first part and a second part, the first part being close to a heat-dissipation-surface (such as the surface farthest from the carrier) of the semiconductor unit, the second part including at least a through-hole for the cylindrical terminal to penetrate, thereby the second part can be close to the terminal connection zone.

DETAILED DESCRIPTION OF THE PREFERRED EMBODIMENTS

Figure 1:
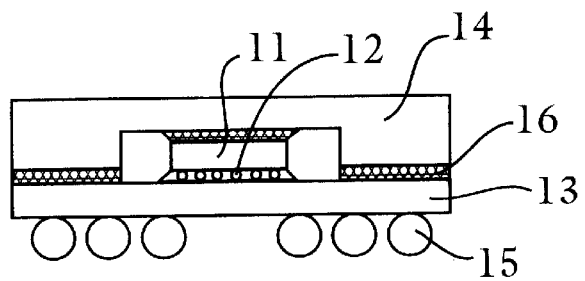
FIG. 1 shows a scheme of connecting a heat dissipater and a substrate in a conventional IC package.
Figure 2:
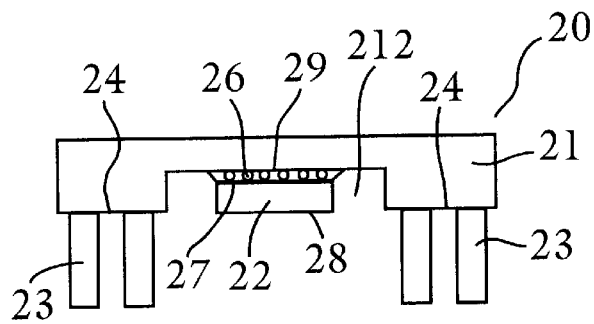
FIG. 2 shows a cross sectional view of an electronic apparatus of an embodiment representing the present invention.
Figure 3:
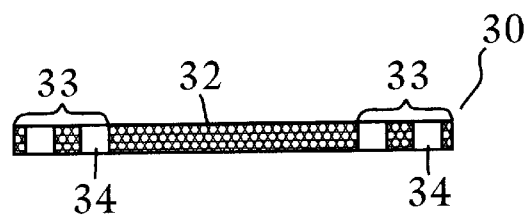
FIG. 3 shows a cross sectional view of a heat dissipater of an embodiment representing the present invention.
Figure 4:
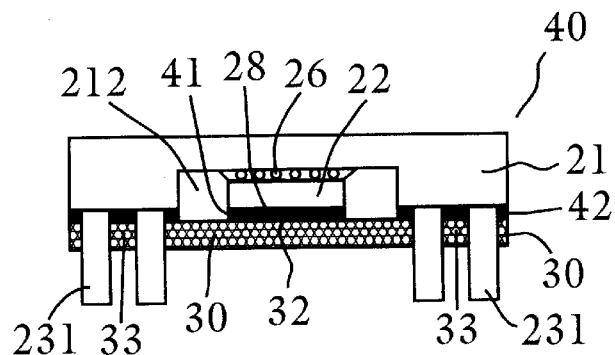
FIG. 4 shows a cross sectional view of a package structure of an embodiment representing the present invention.

FIG. 4 shows a package structure 40 provided by the present invention for achieving better heat dissipation. It comprises:

an electronic apparatus 20 as shown in FIG. 2, which includes a carrier 21, at least a semiconductor unit 22, and at least a cylindrical terminal 23, the semiconductor unit 22 and the cylindrical terminal 23 attaching in approximately the same direction to different portions of the carrier 21, the semiconductor unit 22 attaching to the carrier 21 via a first surface 27 of the semiconductor unit 22, the carrier 21 providing electrical connection between the semiconductor unit 22 and the cylindrical terminal 23;

a heat dissipater 30 as shown in FIG. 3, which includes a first part 32 and a second part 33, the first part 32 being close to a second surface 28 of the semiconductor unit 22, the second part 33 including at least a through-hole 34 for the cylindrical terminal 23 to penetrate, thereby second part 33 may be close to carrier 21, whereby the capability of heat dissipater 30 to conduct heat out of semiconductor unit 22 directly by its first part 32 and indirectly by its second part 33 may be maximized.

It can be seen from FIG. 4 that the package structure 40 provided by the present invention may further comprise adhesive material 41 located between the first part 32 of the heat dissipater 30 and the second surface 28 of the semiconductor unit 22.

According to the package structure 40 in FIG. 4, the semiconductor unit 22 includes at least a bump 26 for connecting the first surface 27 of semiconductor unit 22 and carrier 21, the carrier 21 includes a depression 212 in which semiconductor unit 22 is located, and a connection system (not shown in figure) for electrically connecting bump 26 and cylindrical terminal 23, as well as bonding material 42 for connecting cylindrical terminal 23 thereto, wherein the cylindrical terminal 23 penetrates the heat dissipater 30 to have at least a part 231 thereof outside the heat dissipater 30 for the convenience of connecting external circuits or apparatus,.

Figure 5:
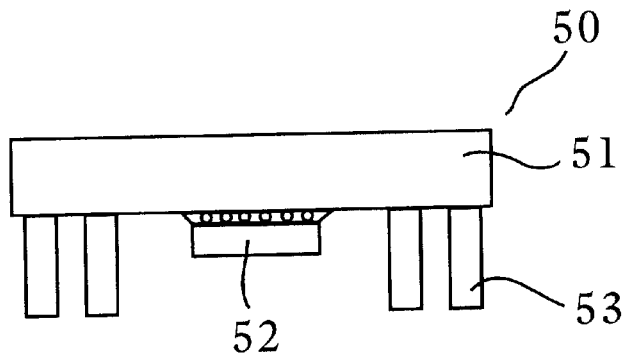
FIG. 5 shows a cross sectional view of an electronic apparatus of another embodiment representing the present invention.
Figure 6:
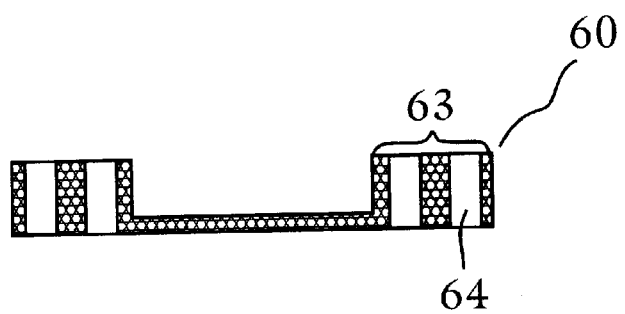
FIG. 6 shows a cross sectional view of a heat dissipater of another embodiment representing the present invention.
Figure 7:
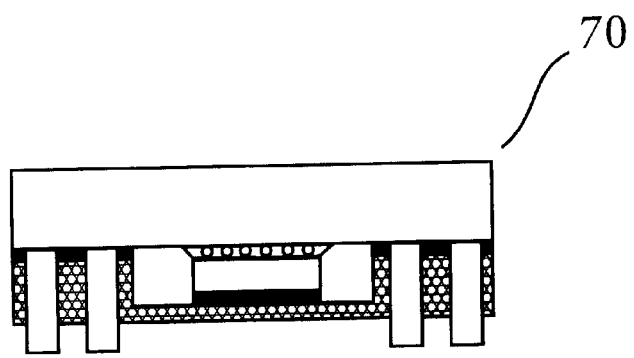
FIG. 7 shows a cross sectional view of a package structure of another embodiment representing the present invention.

FIGS. 5~7 differ from FIGS. 2~4 in that the carrier 51 in FIGS. 5~7 does not include a depression, therefore the whole semiconductor unit 52 therein juts out from carrier 51, and thereby the heat dissipater 60 therein is in U shape as shown in FIG. 6 so that the part 63 of heat dissipater 60 may be close to carrier 51.

Figure 8:
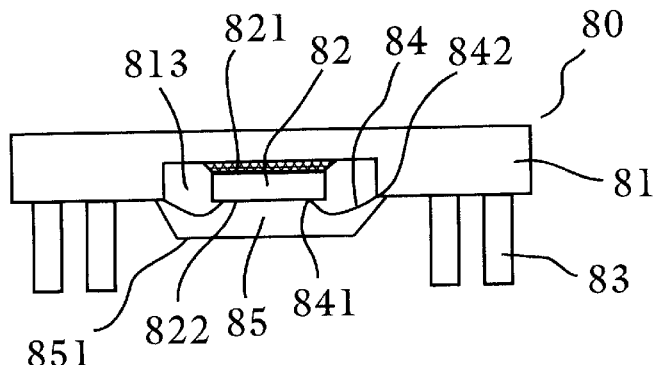
FIG. 8 shows a cross sectional view of an electronic apparatus of a further embodiment representing the present invention.
Figure 9:
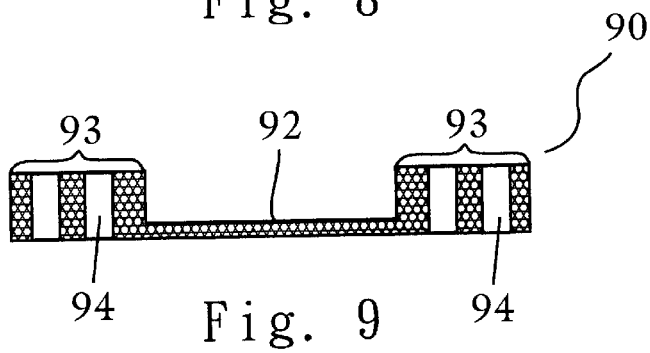
FIG. 9 shows a cross sectional view of a heat dissipater of a further embodiment representing the present invention.
Figure 10:
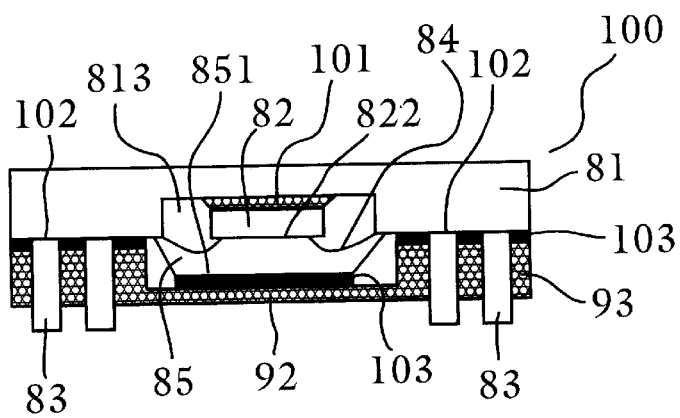
FIG. 10 shows a cross sectional view of a package structure of a further embodiment representing the present invention.

Another type of an embodiment of the present invention is a package structure 100 shown in FIG. 10, which comprises:

an electronic apparatus 80 as shown in FIG. 8 that includes a carrier 81, at least a semiconductor unit 82 such as a wire bonding chip, at least a bonding wire 84, a sealing structure 85, and a cylindrical terminal 83, the semiconductor unit 82 and the cylindrical terminal 83 attaching in approximately the same direction to the carrier 81, the semiconductor unit 82 attaching to the carrier 81 via a first surface 821 of the semiconductor unit 82, the bonding wire 84 having a first end 841 located on a second surface 822 of semiconductor unit 82 for electrically connecting the semiconductor unit 82, bonding wire 84 having a second end 842 for electrically connecting cylindrical terminal 83 via carrier 81, sealing structure 85 covering semiconductor unit 82 and bonding wire 84; and a heat dissipater 90 as shown in FIG. 9 that includes a first part 92 and a second part 93, the first part 92 being close to an outward surface 851 of the sealing structure 85, the second part 93 including at least a through-hole 94 for the cylindrical terminal 83 to penetrate so that second part 93 may be close to carrier 81.

The package structure 100 in FIG. 10 may further comprise adhesive material 101 for semiconductor unit 82 to attach to carrier 81, bonding material 102 for cylindrical terminal 83 to attach to carrier 81, and a connection system (not shown in figure) located on carrier 81 for electrically connecting bonding wire 84 and cylindrical terminal 83. The connection system may include at least a bonding finger (not shown in figure) and at least a trace (not shown in figure). Bonding wire 84 electrically connects the trace via the bonding finger, and the trace electrically connects cylindrical terminal 83.

According to the present invention, the carrier 81 in the package structure in FIG. 10 may or may not include a depression such as the one 813 shown in the figure (FIG. 10), i.e., a depression such as 813 is not always needed for accommodating the semiconductor unit 82. In case the semiconductor unit is not accommodated in a depression, heat dissipater 90 had better be so configured that its has different parts close respectively to semiconductor unit 82 and carrier 81. For example, the first part 92 and the second part 93 of heat dissipater 90 respectively approach the outward surface 851 of sealing structure 85 and the peripheral portion of the carrier 81.

The package structure 100 provided by the present invention may further comprise adhesive material 103 located between the first part 92 of heat dissipater 90 and the outward surface 851 of the sealing structure 85. The adhesive material 103 may be further placed between the second part 93 of heat dissipater 90 and the, carrier 81.

In the package structure shown in FIG. 10, the outward surface 851 of the sealing structure 85 nearly parallels the first part 92 of heat dissipater 90. A preferred embodiment of the package structure is that the sealing structure 85 is configured so as to maximize its outward surface 851. The cylindrical terminal 83 had better be so configured that it may penetrate through-hole 94 to have at least a part of it outside the heat dissipater 90.

The basic architecture of a further embodiment provided by the present invention may comprise:

an electronic apparatus such as 20 in FIG. 2, or 50 in FIG. 5, or 80 in FIG. 8, which includes a carrier, at least a semiconductor unit, at least a cylindrical terminal, and a semiconductor-electrical-connection-device such as the bump 26 in FIG. 2 or bonding wire 84 in FIG. 8, wherein the carrier includes a semiconductor connection zone such as 29 in FIG. 2, a terminal connection zone such as 24 in FIG. 2, and at least a trace (not shown in figure), the cylindrical terminal and the semiconductor unit respectively attach to the terminal connection zone and the semiconductor connection zone in approximately the same direction, or respectively jut out in approximately the same direction from the carrier, the trace electrically connects the cylindrical terminal and electrically connects the semiconductor unit via the semiconductor-electrical-connection-device; and a heat dissipater such as 30 in FIG. 3 or 60 in FIG. 6 or 90 in FIG. 9, which includes a first part and a second part, the first part being close to a heat-dissipation-surface of the semiconductor unit (such as the first part 92 in FIG. 10 that approaches a heat-dissipation-surface 822 of semiconductor unit 82 via sealing structure 85, or the first part 32 in FIG. 4 that approaches the second surface/heat-dissipation-surface 28 of semiconductor unit 22 via adhesive material 41), the second part such as the part 33 in FIG. 4 or the part 93 in FIG. 10 including at least a through-hole for the cylindrical terminal to penetrate, thereby being able to closely approach the terminal connection zone of the carrier.

The structure of the heat dissipater, such as the positions and sizes of its protruded portions and through-holes is configured to match the terminal connection zone (or the cylindrical terminal) and the heat-dissipation-surface of the semiconductor unit (or the outward surface 851 of the sealing structure 85 in FIG. 10).

Figure 11:
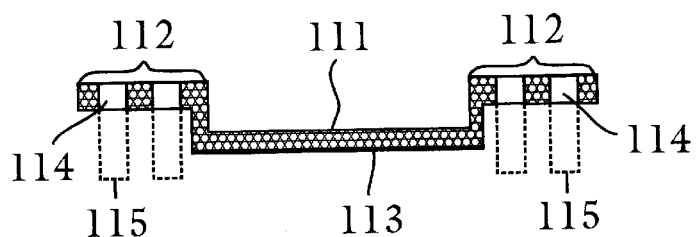
FIG. 11 shows a cross sectional view of a heat dissipater of another further embodiment representing the present invention.

The heat dissipater in FIG. 7 and FIG. 10 may also be in the shape of a sheet as shown in FIG. 11, with its first part 111 being close to the semiconductor's heat-dissipation-surface such as the surface 28 in FIG. 4, or being adjacent to the semiconductor's surface 822 via sealing structure 85 in FIG. 10, and its second part 112 bending toward the carrier to be close to the terminal connection zone. The heat dissipater also includes a most-outward surface 113 (the farthest surface of the heat dissipater relative to the carrier). The cylindrical terminal penetrates the through-hole 114 to reach a position 115 which is beyond the surface or plane defined by the most-outward surface, thereby the connection between the package structure and external circuits (or external apparatus) can be conveniently done via the cylindrical terminals.

While the invention has been described in terms of what are presently considered to be the most preferred embodiments, it shall not be limited to the disclosure. On the contrary, it shall be construed to cover various modifications and similar arrangements as well as any schemes based on the spirit and scope of invention.

What is claimed is:

1. A package for achieving better heat dissipation comprising:

an electronic apparatus including a carrier, at least a semiconductor unit, and at least a cylindrical terminal, said semiconductor unit and said cylindrical terminal attaching in approximately the same direction to different portions of said carrier, said semiconductor unit attaching to said carrier via a first surface of said semiconductor unit, said carrier providing electrical connection between said semiconductor unit and said cylindrical terminal;

a heat dissipater including a first part and a second part, said first part being close to a second surface of said semiconductor unit, said second part including at least a through-hole for said cylindrical terminal to penetrate.

2. The package according to claim 1 further comprising adhesive material located between the first part of said heat dissipater and the second surface of said semiconductor unit.

3. The package according to claim 1 wherein the second part of heat dissipater is close to said carrier.

4. The package according to claim 1 further comprising adhesive material for the second part of said heat dissipater to attach to said carrier.

5. The package according to claim 1 wherein said semiconductor unit includes at least a bump for said first surface thereof to connect said carrier.

6. The package according to claim 5 wherein said carrier includes a connection system for electrically connecting said bump and said cylindrical terminal, and bonding material for connecting said cylindrical terminal and said carrier.

7. The package according to claim 1 wherein said cylindrical terminal penetrates said heat dissipater to have at least a part thereof outside said heat dissipater.

8. The package according to claim 1 wherein said carrier includes a depression in which said semiconductor unit attaches thereto.

9. A package for achieving better heat dissipation comprising:

an electronic apparatus including a carrier, at least a semiconductor unit, at least a bonding wire, a sealing structure, and a cylindrical terminal, said semiconductor unit and said cylindrical terminal attaching in approximately the same direction to said carrier, said semiconductor unit attaching to said carrier via a first surface of said semiconductor unit, said bonding wire having a first end electrically connecting said semiconductor unit via a second surface of said semiconductor unit and having a second end electrically connecting said cylindrical terminal via said carrier, said sealing structure covering said semiconductor unit and said bonding wire; and a heat dissipater including a first part and a second part, said first part being close to said sealing structure, said second part including at least a through-hole for said cylindrical terminal to penetrate.

10. The package according to claim 9 wherein said electronic apparatus includes adhesive material, bonding material, and a connection system, said adhesive material for said semiconductor unit to attach to said carrier, said bonding material for said cylindrical terminal to attach to said carrier.

11. The package according to claim 10 wherein said connection system includes at least a bonding finger and at least a trace, said bonding wire electrically connecting said trace via said bonding finger, said trace electrically connecting said cylindrical terminal.

12. The package according to claim 9 wherein said carrier includes a depression in which said semiconductor unit is located, and said heat dissipater is in the shape of a sheet with both said first part and said second part thereof respectively approaching, in nearly the same direction, said sealing structure and said carrier.

13. The package according to claim 12 further comprising adhesive material which is between said the first part of said heat dissipater and said sealing structure, and also between the second part of said heat dissipater and said carrier.

14. The package according to claim 12 wherein said sealing structure has an outward surface approximately parallel to the first part of said heat dissipater, and is configured so as to have said outward surface maximized.

15. The package according to claim 9 wherein said cylindrical terminal penetrates the second part of said heat dissipater to have at least a part thereof outside said heat dissipater.

16. A package for achieving better heat dissipation comprising:

an electronic apparatus including a carrier, at least a semiconductor unit, at least a cylindrical terminal, and a semiconductor-electrical-connection-device, said carrier including a semiconductor connection zone, a terminal connection zone, and at least a trace, said cylindrical terminal and said semiconductor unit respectively jutting out in approximately the same direction from said carrier, said trace electrically connecting said cylindrical terminal and electrically connecting said semiconductor unit via said semiconductor-electrical-connection-device; and a heat dissipater including a first part and a second part, said first part being close to a heat-dissipation-surface of said semiconductor unit, said second part including at least a through-hole for said cylindrical terminal to penetrate, thereby said second part can be close to said terminal connection zone.

17. The package according to claim 16 wherein said heat dissipater is configured to match the heat-dissipation-surface of said semiconductor unit and said terminal connection zone.

18. The package according to claim 17 wherein said heat dissipater is in the shape of a sheet, with said first part thereof being close to the heat-dissipation surface of said semiconductor unit and said second part thereof bending toward said carrier to be close to said terminal connection zone, said heat dissipater also includes a most-outward surface farthest from to said carrier, and said cylindrical terminal penetrates said cylindrical terminal to reach a position for conveniently connect external circuits.

19. The package according to claim 16 wherein said semiconductor unit is selected from among a flip chip and a wire bonding chip, and said semiconductor-electrical-connection-device is selected from among a bump and a bonding wire according to the selection of said semiconductor unit.

20. The package according to claim 16 further comprising adhesive material which is between the first part of said heat dissipater and the heat-dissipation-surface of said semiconductor unit, and is also between the second part of said heat dissipater and said terminal connection zone.

* * * * *